United States Patent [19]

Borg et al.

[11] 4,287,601
[45] Sep. 1, 1981

[54] SELF-PROGRAMING MEMORY TUNING SYSTEM

[75] Inventors: Arthur N. Borg, Fort Wayne; Jerry D. Trostel, Avilla; Daniel A. Heuer, Fort Wayne, all of Ind.

[73] Assignee: The Magnavox Company, New York, N.Y.

[21] Appl. No.: 86,899

[22] Filed: Oct. 22, 1979

[51] Int. Cl.³ .......................... H04B 1/16; H04B 1/26
[52] U.S. Cl. .................................................. 455/186
[58] Field of Search .............................. 455/185, 186; 358/191.1

[56] References Cited

U.S. PATENT DOCUMENTS 4,093,922  6/1978  Buss ................................. 455/186 X
4,122,395  10/1978 Schotz et al. ..................... 455/186 X Primary Examiner—Robert L. Richardson
Attorney, Agent, or Firm—Thomas A. Briody; Robert T. Mayer

[57] ABSTRACT

Apparatus for automatically restoring information concerning a plurality of broadcast station frequencies in a microprocessor type tuning system when such information is inadvertently lost from a volatile memory.

9 Claims, 2 Drawing Figures

SELF-PROGRAMING MEMORY TUNING SYSTEM

BACKGROUND OF THE INVENTION

This invention relates to that described and claimed in application Ser. No. 932,141 filed Aug. 9, 1978 and assigned to the same assignee as this application.

The forementioned application describes a microprocessor control system for affecting channel selection and function level adjustments. The system uses an electrically alterable ROM to store television broadcast station or channel information which is retrieved by the microprocessor and converted by a digital-to-analog converter into voltages for use by a varactor tuner to tune in channels on a television receiver. Should the electrically alterable ROM lose some or all of the channel information stored in it, a repairman would have to reinsert that information manually in order for the receiver to be able to be tuned to the channels corresponding to the lost information. Alternatively the microprocessor could have stored in its internal ROMs all of the channel information which was also stored in the electrically alterable ROM. Neither of these alternatives is acceptable. The former because it would require the repairman to expend an inordinate amount of time in order to insert this information manually into the ROM. The latter because the duplication would use up too much of the capacity of the internal ROMs.

SUMMARY OF THE INVENTION

In accordance with the invention, a program and selective channel information is stored in the microprocessor by which approximate channel information for the electrically alterable ROM can be reconstructed by the microprocessor and restored to the electrically alterable ROM automatically. This relieves the repairman of the need of having to do all of this manually. It also uses much less capacity of the internal ROMs than would be used if all of the channel information for the electrically alterable ROM was also to be stored in the internal ROMs.

DESCRIPTION OF THE PREFERRED EMBODIMENT

Figure 1:
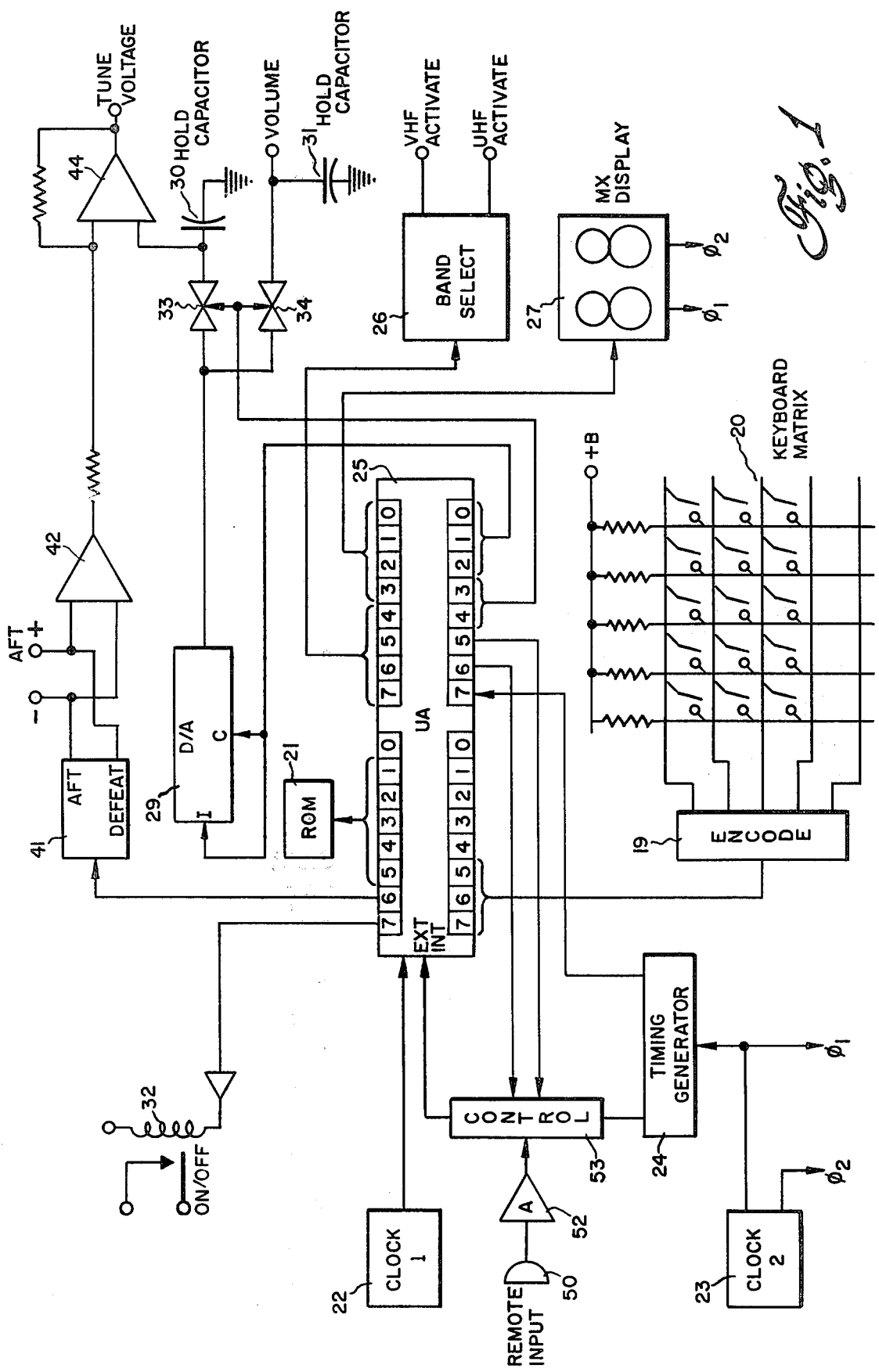
FIG. 1 is a schematic drawing of the apparatus by which the invention is practiced.
Figure 2:
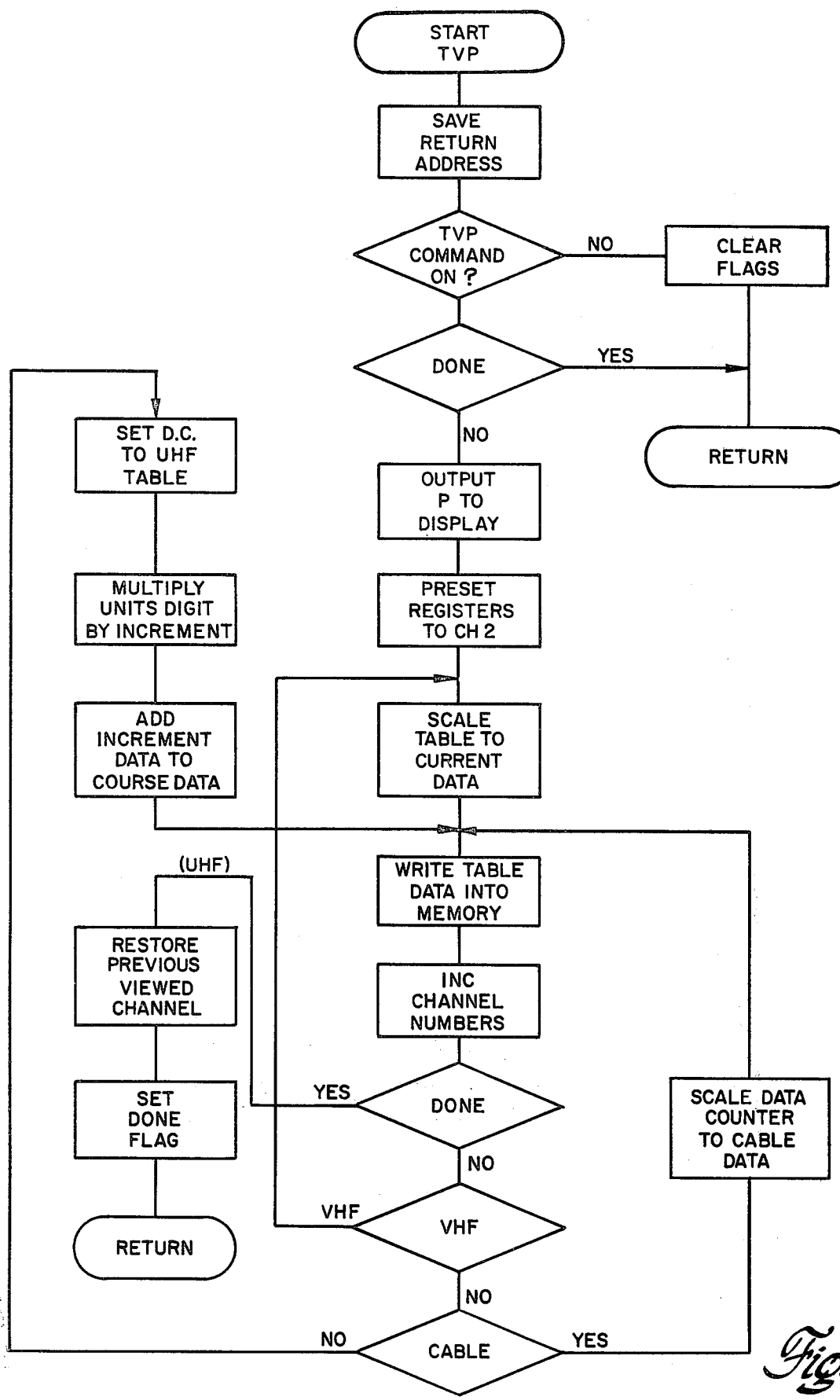
FIG. 2 is a flow diagram of the program for practicing the invention.

FIG. 1 shows apparatus which is also shown in FIG. 2 of the forementioned application Ser. No. 932,141. Rather than duplicate the description of that apparatus contained therein that application is incorporated entirely herein by reference.

From the flow chart of FIG. 2 and the program which follows as listed, a skilled programmer could duplicate the constructed embodiment of the invention and practice it in accordance with the preferred manner. In the constructed embodiment, there was stored in the internal ROMs of microprocessor 25 binary information identifying the voltage levels required across the varactor tuner in order to tune to each of the VHF channels 2 through 13. The following table shows the voltage levels for each of these channels for the particular varactors employed in the tuner of the constructed embodiment.

| Channel | Tuning Voltage Volts |
|---------|----------------------|
| VHF     |                      |
| 2       | 4.5                  |
| 3       | 6.8                  |
| 4       | 9.3                  |
| 5       | 14.7                 |
| 6       | 22.0                 |
| 7       | 11.0                 |
| 8       | 12.1                 |
| 9       | 13.1                 |
| 10      | 14.4                 |
| 11      | 15.8                 |
| 12      | 18.0                 |
| 13      | 22.0                 |
| UHF     |                      |
| 10      | 1.5                  |
| 20      | 3.8                  |
| 30      | 6.2                  |
| 40      | 9.0                  |
| 50      | 11.8                 |
| 60      | 14.2                 |
| 70      | 17.1                 |
| 80      | 22.0                 |

The apparent ambiguities in the voltages for the VHF channels in this table exist because the inductance of the tuner is changed depending upon whether channels 2 through 6 are being tuned or whether channels 7 through 13 are being tuned. The particular tuner used employs less inductance when tuning channels 7 through 13 than when tuning channels 2 through 6. This decreased inductance in the tuned circuits automatically raises their resonant frequencies and lowers the voltage which is needed across the varactors to tune channels 7 through 13.

Also stored in digital form in the internal ROMs of microprocessor 25 is information identifying predetermined ones of the UHF channels. The foregoing table shows the voltage levels for tuning each one of the selected UHF channels whose identifying information is stored in the internal ROMs. From these voltage levels it can be seen that the varactor tuner used for the UHF channels is different from that used for the VHF channels. It can also be seen that information identifying a channel 10 in the UHF band was stored. Of course there is no channel 10 in the UHF band. Information which would be equivalent to a channel 10 in the UHF band was stored however, in order to simplify the program by which the information identifying each of the UHF channels is reconstructed. The other selected UHF channels are those which start each of the decades in the UHF spectrum, namely, channels 20, 30, 40, 50, 60, 70 and 80.

From the foregoing table it can be seen that the UHF channel at the start of each decade in the spectrum is separated from the UHF channel at the start of the next highest decade by a known voltage. It can also be seen that each of these voltage separations is not the same. By dividing each of these voltage separations by ten an increment is obtained which approximately represents the difference between each adjacent UHF channel in each decade. Information in digital form representing each of these increments is also stored in the internal ROM of the microprocessor.

In practicing the invention a particular entry would be made in keyboard 20. Thereupon microprocessor 25 would start the program as listed. During the course of that program microprocessor 25 would retrieve from the storage means comprising its internal ROMs the digital information identifying each of the VHF channels and would store that information in particular locations in the electrically alterable ROM 21. After completing that retrieval and storage operation, microprocessor 25 would then retrieve the digital information corresponding to UHF channel 10 from the appropriate location in its internal ROM. This information would be stored in a temporary register. The 10s decade increment would then be retrieved from the internal ROM. After multiplying this increment by 4 the resulting binary number would be added to the digital information identifying UHF channel 10 and that result would at least, approximately identify UHF channel 14. This identifying information would then be stored in an appropriate location in electrically alterable ROM 21. The digital information, at least approximately identifying the channels in each of the decades is similarly reconstructed from the identifying information of the channel at the start of the associated decade and the associated increment until all 70 UHF channels are stored in electrically alterable ROM 21.

Although the stored information for the most part will only approximate that identifying the UHF channels it is accurate enough to enable each of the channels to be tuned in closely enough to permit the receiver's automatic fine tuning control to tune in each channel accurately once selected. Microprocessor 25 then updates the information for that station in electrically alterable ROM 21.

Changes in the above embodiment are possible without departing from the scope of the invention. Consequently it is intended that all matter contained in the above or shown in the accompanying drawings be interpreted as illustrative and not in any sense limiting.

"APPENDIX A"

```
 FORMULATOR ASSEMBLER  (REV 3.0)
 TUNING VOLTAGE PRESET ROUTINE
ERRS  LOC OBJECT  ADDR  LINE              SOURCE STATEMENT

0001   * TVPLI
                        0002   * TUNING VOLTAGE PRESET ROUTINE
                        0003   * DANIEL A. HEUER.
                        0004   * 12-2-77    REVISION 0    12-2-77
                        0005   * 12-19-77   REVISION A ADD CHR,CHG R8 TO R7
                        0006   * 2-3-78 REV LES-A MAKE BANDS IN TABLE RIGHT
                        0007   * 2-17-78 . REV LES-B CORRECT 70'S INC,CH 90
                        0008   * 2-20-78   REV LES-C CORRECT MORE VOLTAGES
                        0009   ************************************************
                        0010          TITLE    'TUNING VOLTAGE PRESET ROUTINE'
:0B00000254565020202020202000000257
               0000     0011   TVP    RORG     0
                        0012          EXTRN    CHR,CHA,BND
                        0013   * SAVE RETURN ADDR IN Q
 0000 08               0014          LR       K,P
 0001 00               0015          LR       A,KU
 0002 06               0016          LR       QU,A
 0003 01               0017          LR       A,KL
 0004 07               0018          LR       QL,A
                        0019   * CHECK FOR TVP COMMAND
 0005 63               0020          LISU     3        ISAR TO SCAN 3
 0006 6C               0021          LISL     4
 0007 71               0022          LIS      1
 0008 FC               0023          NS       S
 0009 9403  000D       0024          BNZ      TV1      BR IF COMMAND ON
 000B 57               0025          LR       7,A      CLR FLAG
                        0026   ********************
                        0027   ** RETURN **
 000C 0D               0028   TV0    LR       P0,Q
 000D 70               0029   TV1    CLR
 000E C7               0030          AS       7
                        0031   * RETURN IF COMMAND COMPLETE
 000F 94FC  000C       0032          BNZ      TV0
                        0033   * OUTPUT P TO DISPLAY
 0011 7C               0034          LIS      H'C'
 0012 B4               0035          OUTS     4
 0013 72               0036          LIS      2
                        0037   *SET CHAN 2
 0014 66               0038          LISU     6        SET ISAR TO R62
 0015 6A               0039          LISL     2
 0016 5D               0040          LR       I,A
 0017 5D               0041          LR       I,A
```

FORMULATOR ASSEMBL (REV 3.0)
TUNING VOLTAGE PRESE ROUTINE
ERRS LOC OBJECT ADDR LINE                SOURCE STATEMENT

```
                     0042   * GET VHF CHANNEL DATA
     0018 66         0043   TV2   LISU   6
     0019 6B         0044         LISL   3
     001A 4C         0045         LR     A,S       GET BINARY CH NUM
     001B 2A00AD 00AD 0046        DCI    TVHF      SET DC TO VHF DATA
     001E 24FE       0047         AI     H'FE'     SUBTRACT 2
     0020 13         0048         SL     1
:21000000080006010763 6C71FC9403570D70C794FC7CB472666A5D5D666B4C2A00AD24FE1376
     0021 8E         0049         ADC              SCALE DC
     0022 68         0050   TV2A  LISL   0
     0023 16         0051         LM
     0024 5D         0052         LR     I,A
     0025 16         0053         LM
     0026 5C         0054         LR     S,A
     0027 66         0055   TV3   LISU   6          GET CHANNEL NUMBER
     0028 6A         0056         LISL   2
     0029 4C         0057         LR     A,S
     002A 54         0058         LR     4,A        PUT CH NUM IN R4
     002B 280000 0000 0059        PI     CHR
                     0060   *INC CHANNEL NUMBER
     002E 66         0061         LISU   6
     002F 6A         0062         LISL   2
     0030 2067       0063         LI     H'67'      INC BCD CH NUM
     0032 DC         0064         ASD    S
     0033 5D         0065         LR     I,A
     0034 4C         0066         LR     A,S        INC BINARY CH NUM
     0035 1F         0067         INC
     0036 5E         0068         LR     D,A
     0037 255B       0069         CI     H'5B'
     0039 913E  0078 0070         BM     TV6        BR IF LAST CHAN
     003B 250D       0071         CI     H'0D'
     003D 81DA  0018 0072         BP     TV2        BR IF CH<14
     003F 2553       0073         CI     H'53'
:210021008E68165D165C666A4C542800006 66A2067DC5D4C1F5E255B913E250D81DA2553910D
     0041 912A  006C 0074         BM     TV5A       BR IF CH>83
                     0075   *GET UHF TUNING DATA
     0043 2A0095 0095 0076        DCI    TUHF       SET DC TO UHF TABLE
     0046 4C         0077         LR     A,S
     0047 24F0       0078         AI     H'F0'
     0049 14         0079         SR     4          GET 10'S DIGIT
     004A 50         0080         LR     0,A        MULTIPLY BY 3
     004B 13         0081         SL     1
     004C C0         0082         AS     0
     004D 8E         0083         ADC               SCALE DC
     004E 16         0084         LM               GET UHF DATA
     004F 50         0085         LR     0,A        LSBY IN R0
     0050 16         0086         LM
     0051 51         0087         LR     1,A        MSBY IN R1
     0052 16         0088         LM
     0053 52         0089         LR     2,A        INCREMENT IN R2
     0054 7F         0090         LIS    H'F'       MASK LSD OF CH NUM
     0055 FC         0091         NS     S
     0056 53         0092         LR     3,A        SAVE IN R3
     0057 33         0093   TV4   DS     3
     0058 910B  0064 0094         BM     TV5        BR WHEN LSD ZERO
     005A 42         0095         LR     A,2        ADD INC TO LSBY
     005B C0         0096         AS     0
     005C 50         0097         LR     0,A
     005D 92F9  0057 0098         BNC    TV4        BR IF NO CARRY TO MSBY
     005F 41         0099         LR     A,1        INC MSBY IF CARRY
     0060 1F         0100         INC
     0061 51         0101         LR     1,A
:210042002A2A00954C24F0145013C08E1650165116527FFC5333910B42C05092F9411F51909F
     0062 90F4  0057 0102         BR     TV4
     0064 66         0103   TV5   LISU   6          PUT DATA IN TRANSFER RE
     0065 68         0104         LISL   0
     0066 40         0105         LR     A,0
     0067 5D         0106         LR     I,A
     0068 41         0107         LR     A,1
```

FORMULATOR ASSE    ER (REV 3.0)
TUNING VOLTAGE PRESET ROUTINE
ERRS  LOC OBJECT ADDR  LINE              SOURCE STATEMENT 0069 5C             0108       LR    S,A
      006A 90BC   0027    0109       BR    TV3
                          0110   *MIDBAND CABLE
      006C 66             0111  TV5A LISU  6         GET BINARY CH NUM
      006D 6B             0112       LISL  3
      006E 20AC           0113       LI    H'AC'     SUBTRACT 84
      0070 CC             0114       AS    S
      0071 13             0115       SL    1         MULTIPLY BY 2
      0072 2A00C5  00C5   0116       DCI   TCBL      SET DC TO CABLE TABLE
      0075 8E             0117       ADC
      0076 90AB   0022    0118       BR    TV2A
                          0119   *RESTORE CHANNEL
      0078 65             0120  TV6  LISU  5
      0079 6B             0121       LISL  3
      007A 4C             0122       LR    A,S       PUT ADDR IN R4
      007B 54             0123       LR    4,A
      007C 280000 0000    0124       PI    CHA       GET CHANNEL
      007F 66             0125       LISU  6
      0080 69             0126       LISL  1
      0081 4E             0127       LR    A,D
      0082 50             0128       LR    0,A
      0083 4D             0129       LR    A,I
:21006300F46668405D415C90BC666B20ACCC132A00C58E90AB656B4C5428000066694E504DAE
      0084 62             0130       LISU  2         ISAR TO D-A LOWER
      0085 5D             0131       LR    I,A
      0086 40             0132       LR    A,0
      0087 5C             0133       LR    S,A
      0088 14             0134       SR    4
      0089 2A0000 0000    0135       DCI   BND       GET BAND
      008C 8E             0136       ADC
      008D A1             0137       INS   1
      008E 210F           0138       NI    H'0F'
      0090 88             0139       AM
      0091 B1             0140       OUTS  1
                          0141   * SET FLAG
      0092 71             0142       LIS   1
      0093 57             0143       LR    7,A
                          0144   * RETURN *
      0094 0D             0145       LR    P0,Q
                          0146  *******************************************
                          0147  * UHF VOLTAGE TABLE
      0095 C5             0148  TUHF DC    H'C5'     10'S DATA
      0096 20             0149       DC    H'20'
      0097 1F             0150       DC    H'1F'     10'S INCREMENT
      0098 FF             0151       DC    H'FF'     20'S DATA
      0099 21             0152       DC    H'21'
      009A 20             0153       DC    H'20'     20'S INCREMENT
      009B 41             0154       DC    H'41'     30'S DATA
      009C 23             0155       DC    H'23'
      009D 25             0156       DC    H'25'     30'S INCREMENT
      009E B9             0157       DC    H'B9'     40'S DATA
      009F 24             0158       DC    H'24'
      00A0 25             0159       DC    H'25'     40'S INCREMENT
      00A1 31             0160       DC    H'31'     50'S DATA
      00A2 26             0161       DC    H'26'
      00A3 20             0162       DC    H'20'     50'S INCREMENT
      00A4 74             0163       DC    H'74'     60'S DATA
:21008400625D405C142A00008EA1210F88B171570DC5201FFF2120412325B924253126207498
      00A5 27             0164       DC    H'27'
      00A6 27             0165       DC    H'27'     60'S INCREMENT
      00A7 FA             0166       DC    H'FA'     70'S DATA
      00A8 28             0167       DC    H'28'
      00A9 44             0168       DC    H'44'     70'S INCREMENT
      00AA A2             0169       DC    H'A2'     80'S DATA
      00AB 2B             0170       DC    H'2B'
      00AC 86             0171       DC    H'86'     80'S INCREMENT
                          0172   * VHF VOLTAGE TABLE
      00AD 5D             0173  TVHF DC    H'5D'     CH 2
      00AE 02             0174       DC    H'02'

FORMULATOR ASSEMBLER (REV 3.0)
TUNING VOLTAGE PRESET ROUTINE
ERRS   LOC OBJECT ADDR LINE            SOURCE STATEMENT

```
       00AF 92        0175    DC      H'92'   CH 3
       00B0 03        0176    DC      H'03'
       00B1 E2        0177    DC      H'E2'   CH 4
       00B2 04        0178    DC      H'04'
       00B3 B7        0179    DC      H'B7'   CH 5
       00B4 07        0180    DC      H'07'
       00B5 8C        0181    DC      H'8C'   CH 6
       00B6 0B        0182    DC      H'0B'
       00B7 C6        0183    DC      H'C6'   CH 7
       00B8 15        0184    DC      H'15'
       00B9 5A        0185    DC      H'5A'   CH 8
       00BA 16        0186    DC      H'16'
       00BB E0        0187    DC      H'E0'   CH 9
       00BC 16        0188    DC      H'16'
       00BD 8F        0189    DC      H'8F'   CH 10
       00BE 17        0190    DC      H'17'
       00BF 4B        0191    DC      H'4B'   CH 11
       00C0 18        0192    DC      H'18'
       00C1 73        0193    DC      H'73'   CH 12
       00C2 19        0194    DC      H'19'
       00C3 8C        0195    DC      H'8C'   CH 13
       00C4 1B        0196    DC      H'1B'
                      0197  * CABLE DATA
       00C5 FE        0198  TCBL DC   H'FE'   CH 84 B
:2100A5002727FA2844A22B865D029203E204B7078C0BC6155A16E0168F174B1873198C1BFE89
       00C6 11        0199    DC      H'11'
       00C7 78        0200    DC      H'78'   CH 85 C
       00C8 12        0201    DC      H'12'
       00C9 FE        0202    DC      H'FE'   CH 86 D
       00CA 12        0203    DC      H'12'
       00CB 77        0204    DC      H'77'   CH 87 E
       00CC 13        0205    DC      H'13'
       00CD F0        0206    DC      H'F0'   CH 88 F
       00CE 13        0207    DC      H'13'
       00CF 69        0208    DC      H'69'   CH 89 G
       00D0 14        0209    DC      H'14'
       00D1 D4        0210    DC      H'D4'   CH 90 H
       00D2 14        0211    DC      H'14'
       00D3 40        0212    DC      H'40'   CH 91 I
       00D4 15        0213    DC      H'15'
                      0214  ******************************************
                      0215    END
:0F00C600117812FE127713F0136914D414401539
:120000001001C02002C2104402007302007D22008A237B
:21000B0243485220202020200000021434884120202020200000022424E4420202020200000230F
:0000D5002B
```

FORMULATOR ASSEMBLER (REV 3.0)
TUNING VOLTAGE PRESET ROUTINE
SYMBOL TYP VAL  REFERENCES

```
BND     X 0000   0135
CHA     X 0000   0124
CHR     X 0000   0059
TCBL    L 00C5   0116
TUHF    L 0095   0076
TV0     L 000C   0032
TV1     L 000D   0024
TV2     L 0018   0072
TV2A    L 0022   0118
TV3     L 0027   0109
TV4     L 0057   0102   0098
TV5     L 0064   0094
TV5A    L 006C   0074
TV6     L 0078   0070
TVHF    L 00AD   0046
TVP     L 0000
```

END ASM
00 ERRS
00 ERRS

```
LES START-UP ROUTINE
ERRS  LOC OBJECT ADDR
                      LINE            SOURCE STATEMENT

0001    * STUPTLI
                      0002    * LES STARTUP ROUTINE
                      0003    * SET START ADDRESS TO H'001
                      0004    * DANIEL A. HEUER
                      0005    * ORIGINAL 7-28-77
                      0006    * 10-25-77    REVISION D    10-25-77
                      0007    * 1-18-78 REV LES-B    REMOVED WAIT JUMP
                      0008    * 12-14-77 REV A    REVISED DATA TABLES,DEL NSC
                      0009    * 7-7-78 REV LES-C ADDED STARTUP DELAY FOR POWER SUP
                      0010    ************************************************
                      0011          TITLE    'LES START-UP ROUTINE'
           0000       0012    SUR0  RORG     0
                      0013          ENTRY    CHA,BND,TSD,SLD
                      0014          EXTRN    MPO,PRS,NES,RAAS,RRRS,RRDS
                      0015    * DISABLE INTERUPTS
0000 1A               0016          DI                DISABLE INTERUPTS
                      0017    * CLEAR REG
0001 60               0018          LISU     0
0002 68               0019          LISL     0
0003 70               0020    SUR1  CLR
0004 5C               0021          LR       S,A
0005 0A               0022          LR       A,IS      INC ISAR
0006 1F               0023          INC
0007 0B               0024          LR       IS,A
0008 253F             0025          CI       H'3F'     BR ON OCTAL 77
000A 81F8  0003       0026          BP       SUR1
000C 2B               0027          NOP
                      0028    * BLANK DISPLAY
000D 20FF             0029          LI       H'FF'
000F B4               0030          OUTS     4
                      0031    * 0.5 SEC DELAY
0010 20FA             0032          LI       H'FA'     SET TIMER 25 MSEC
0012 B7               0033          OUTS     7
0013 20EA             0034          LI       H'EA'     SET INT CONTROLS
0015 B6               0035          OUTS     6
0016 2014             0036          LI       H'14'     LOAD INT CNTR
0018 50               0037          LR       0,A
0019 2B               0038          NOP
001A 9006  0021       0039          BR       SUR2
                      0040    **** TIMER INTERUPT ****
                      0041    ************************************************
           0020       0042    TINT  ORG      H'20'
0020 0D               0043          LR       P0,Q
                      0044    ************************************************
0021 2A0025  0025     0045    SUR2  DCI      SURA      SET INT ADDR
0024 0E               0046          LR       Q,DC
0025 30               0047    SURA  DS       0
0026 9104  002B       0048          BM       SURB      BR IF TIMED OUT
0028 1B               0049          EI
0029 90FF  0029       0050          BR       *
002B 1A               0051    SURB  DI
002C 70               0052          CLR
002D B6               0053          OUTS     6         CLR TIMER CONTROL
                      0054    * CHECK FOR POWER SUPPLY READY
002E A6               0055    SURC  INS      6         GET INT PORT
002F 81FE  002E       0056          BP       SURC      BR IF INT PIN LOW
                      0057    * GET LAST CHANNEL
0031 28005B  005B     0058          PI       CHA       CALL CHANNEL FETCH
0034 66               0059          LISU     6
```

LES START-UP ROUTINE
ERRS LOC OBJECT ADDR LINE           SOURCE STATEMENT

```
0035 68              0060          LISL    0
0036 2066            0061          LI      H'66'       ADD BCD 0 TO ADDR
0038 DC              0062          ASD     S
0039 54              0063          LR      4,A         LOAD LAST ADDR IN R4
003A 55              0064          LR      5,A
003B 28005B 005B     0065          PI      CHA         CALL CHANNEL ACCESS
003E 66              0066          LISU    6           GET D/A
003F 69              0067          LISL    1
0040 4E              0068          LR      A,D
0041 56              0069          LR      6,A
0042 4D              0070          LR      A,I
0043 62              0071          LISU    2           ISAR TO R21 D/A LOWER
0044 5D              0072          LR      I,A         D/A LOWER
0045 46              0073          LR      A,6         D/A UPPER
0046 5D              0074          LR      I,A
0047 45              0075          LR      A,5         GET DISPLAY
0048 5C              0076          LR      S,A
0049 65              0077          LISU    5           ISAR TO R53 ADDR
004A 5C              0078          LR      S,A         NEW ADDRESS IN R53
004B 62              0079          LISU    2           SAVE DISPLAY
004C 6B              0080          LISL    3
004D 5C              0081          LR      S,A
                     0082  * OUTPUT BAND
004E 2A0075 0075     0083          DCI     BND
0051 46              0084          LR      A,6         GET D/A UPPER
0052 14              0085          SR      4           RIGHT JUSTIFY
0053 2103            0086          NI      H'03'       MASK
0055 8E              0087          ADC
0056 16              0088          LM                  GET DATA
0057 B1              0089          OUTS    1           OUTPUT
                     0090  * JUMP TO 60 HZ WAIT
0058 290000 0000     0091          JMP     MP0
                     0092  * MEMORY FETCH ROUTINE
005B 08              0093  CHA     LR      K,P         SAVE RETURN ADDRESS
005C 280000 0000     0094          PI      PRS         PRECHARGE
005F 280000 0000     0095          PI      NES         NEG EDGE
0062 280000 0000     0096          PI      RAAS        ACCEPT ADDRESS
0065 280000 0000     0097          PI      NES         NEG EDGE
0068 280000 0000     0098          PI      RRRS        READ
006B 280000 0000     0099          PI      NES         NEG EDGE
006E 280000 0000     0100          PI      RRDS        SHIFT DATA OUT
0071 280000 0000     0101          PI      NES         NEG EDGE
0074 0C              0102          PK                  RETURN
                     0103  ******************************************
                     0104  * DATA TABLES
0075 E0              0105  BND     DC      H'E0'       BAND TABLE
0076 D0              0106          DC      H'D0'
0077 B0              0107          DC      H'B0'
0078 70              0108          DC      H'70'
0079 F4              0109  TSD     DC      H'F4'       -3    VHF SLOPE
007A F3              0110          DC      H'F3'       -3.25
007B F2              0111          DC      H'F2'       -3.5
007C F0              0112          DC      H'F0'       -4.0
007D EC              0113          DC      H'EC'       -5.0
007E E8              0114          DC      H'E8'       -6.0
007F E3              0115          DC      H'E3'       -7.5
0080 DF              0116          DC      H'DF'       -8.25
0081 FC              0117          DC      H'FC'       -1.0
0082 FC              0118          DC      H'FC'       -1.0
0083 FB              0119          DC      H'FB'       -1.25
0084 FA              0120          DC      H'FA'       -1.5
0085 F6              0121          DC      H'F6'       -2.5
0086 F4              0122          DC      H'F4'       -3.0
```

LES START-UP ROUTINE
ERRS  LOC OBJECT ADDR LINE                SOURCE STATEMENT

```
        0087 F1           0123       DC      H'F1'    -3.75
        0088 F0           0124       DC      H'F0'    -4.0
        0089 1E           0125  SLD  DC      D'30'    SPEED DATA VHF
        008A 19           0126       DC      D'25'
        008B 15           0127       DC      D'21'
        008C 11           0128       DC      D'17'
        008D 0C           0129       DC      D'12'
        008E 08           0130       DC      D'08'
        008F 04           0131       DC      D'04'
        0090 00           0132       DC      D'00'
        0091 3C           0133       DC      D'60'    SPEED DATA UHF
        0092 33           0134       DC      D'51'
        0093 2B           0135       DC      D'43'
        0094 22           0136       DC      D'34'
        0095 19           0137       DC      D'25'
        0096 11           0138       DC      D'17'
        0097 09           0139       DC      D'09'
        0098 00           0140       DC      D'00'
                          0141  ****************************************
                          0142       END
```

END ASM
00 ERRS
00 ERRS

ASM WRTLI TO WRTOB XREF

LES TUNING WRITE IN RAM
ERRS  LOC OBJECT ADDR
                    LINE                SOURCE STATEMENT

```
                    0001  * WRTLI
                    0002  * LES TUNING WRITE IN RAM
                    0003  * DANIEL A. HEUER
                    0004  * ORIGINAL 7-11-77
                    0005  * 10-26-77    REVISION 0    10-26-77
                    0006  * 12-19-77    REVISION A    CHG DISP BLNK,ADD CHR
                    0007  * 1-17-78 REV LES-B   REMOVED WAIT RETURN NOW RETURN
                    0008  ****************************************************
                    0009       TITLE   'LES TUNING WRITE IN RAM'
        0000        0010  WRTO RORG    0
                    0011       ENTRY   TWRT,CHW,CHR
                    0012       EXTRN   PRS,NES,RADS,RAAS,WRS,ERS
0000 65             0013  TWRT LISU    5         GET ADDRESS FOR
0001 6B             0014       LISL    3         TUNING DATA
0002 4C             0015       LR      A,S
0003 54             0016       LR      4,A
0004 62             0017       LISU    2         SET ISAR TO
0005 6A             0018       LISL    2         D/A UPPER
0006 4E             0019       LR      A,D       LOAD DATA
0007 51             0020       LR      1,A       PUT IN R1
0008 4C             0021       LR      A,S
0009 66             0022       LISU    6         PUT DATA IN
000A 68             0023       LISL    0         TRANSFER REGISTERS
000B 5D             0024       LR      I,A
000C 41             0025       LR      A,1
000D 5C             0026       LR      S,A
                    0027  *BLANK DISPLAY
000E 20FF           0028  CHW  LI      H'FF'     BLANK DISPLAY
0010 B4             0029       OUTS    4         OUTPUT BLANK
0011 08             0030  CHR  LR      K,P       SAVE RETURN
                    0031  * CHANNEL WRITE
0012 280000 0000    0032       PI      PRS       PRECHARGE
0015 280000 0000    0033       PI      NES       NEG EDGE
0018 280000 0000    0034       PI      RAAS      ACCEPT ADDRESS
001B 280000 0000    0035       PI      NES       NEG EDGE
001E 280000 0000    0036       PI      ERS       ERASE
```

```
LES TUNING WRITE IN RAM
ERRS  LOC  OBJECT  ADDR  LINE          SOURCE STATEMENT 0021 230000  0000  0037    PI      NES
      0024 230000  0000  0038    PI      RADS    RAM ACCEPT DATA
      0027 230000  0000  0039    PI      NES
      002A 230000  0000  0040    PI      WRS     WRITE DATA
      002D 230000  0000  0041    PI      NES
      0030 0C            0042    PK              RETURN
                         0043    ++++++++++++++++++++++++++++++++++++++++++++
                         0044            END
```

What is claimed is:

1. A broadcast receiver tuning system comprising:
memory means simultaneously storing information identifying the frequencies of a plurality of broadcast stations;
storage means storing information identifying a predetermined frequency and information identifying an incremental frequency;
generating means receiving the information identifying said predetermined frequency and the information identifying the incremental frequency and generating from said received information information identifying the approximate frequencies of each of said plurality of broadcast stations; and
conducting means conducting said information identifying said approximate frequencies from said generating means to said memory means.

2. A broadcast receiver according to claim 1, wherein said broadcast receiver is a television receiver and the plurality of broadcast stations having information identifying their approximate frequencies generated by said generating means includes UHF channels and said generating means generates that information in digital form.

3. A broadcast receiver according to claim 2, wherein said storage means stores information identifying the frequency of each of the twelve VHF channels.

4. A broadcast receiver according to claim 3, wherein the information identifying the frequencies of each of the twelve VHF channels is stored in digital form by said storage means.

5. A broadcast receiver according to claim 4, wherein said memory means stores said information identifying the frequencies of said VHF channels and said information identifying the approximate frequencies of said UHF channels in digital form.

6. A broadcast receiver according to claim 5, wherein said storage means includes internal registers of a microprocessor.

7. A broadcast receiver according to claim 6, wherein said generating means includes the arithmetic logic unit of said microprocessor.

8. A broadcast receiver according to claim 7, wherein said memory means includes an electrically alterable read only memory.

9. A broadcast receiver according to claim 8, wherein said storage means includes a read only memory.

* * * * *